(12) United States Patent
Zangl et al.

(10) Patent No.: US 7,805,283 B2
(45) Date of Patent: Sep. 28, 2010

(54) METHOD FOR HISTORY MATCHING A SIMULATION MODEL USING SELF ORGANIZING MAPS TO GENERATE REGIONS IN THE SIMULATION MODEL

(75) Inventors: Georg Zangl, Laxenburg (AT); Michael Stundner, Baden (AT)

(73) Assignee: Schlumberger Technology Corporation, Sugar Land, TX (US)

( * ) Notice: Subject to any disclaimer, the term of this patent is extended or adjusted under 35 U.S.C. 154(b) by 808 days.

(21) Appl. No.: 11/595,508

(22) Filed: Nov. 10, 2006

(65) Prior Publication Data

US 2007/0198234 A1   Aug. 23, 2007

Related U.S. Application Data

(60) Provisional application No. 60/774,589, filed on Feb. 17, 2006.

(51) Int. Cl.
*G06F 7/60* (2006.01)
*G06F 17/10* (2006.01)

(52) U.S. Cl. .......................................................... 703/2
(58) Field of Classification Search ........................ 703/2
See application file for complete search history.

(56) References Cited

U.S. PATENT DOCUMENTS 6,078,869 A   6/2000   Gunasekera

| | | |
|---|---|---|
| 6,950,786 B1 | 9/2005 | Sonneland et al. |
| 2006/0092766 A1* | 5/2006 | Shelley et al. .................. 367/72 |
| 2007/0016389 A1* | 1/2007 | Ozgen .......................... 703/10 |

OTHER PUBLICATIONS

Shreeve, S.M. et. al., "Determination of Gas Reservoir Permeabilities Using a Nonlinear Optimization Technique", Journal of Petroleum Science and Engineering 5 (1991), 187-193.
Milliken, W.J. et.al., "Application of 3D Sstreamline Simulation to Assist History Matching", SPE 74712 paper, Dec. 2001, SPE Reservoir Evaluation & engineering, 502-508.

* cited by examiner

*Primary Examiner*—Kamini S Shah
*Assistant Examiner*—Saif A Alhija

(57) ABSTRACT

A method of history matching a simulation model is disclosed comprising: (a) defining regions exhibiting similar behavior in the model thereby generating the model having a plurality of regions, each of the plurality of regions exhibiting a similar behavior; (b) introducing historically known input data to the model; (c) generating output data from the model in response to the historically known input data; (d) comparing the output data from the model with a set of historically known output data; (e) adjusting the model when the output data from the model does not correspond to the set of historically known output data, the adjusting step including the step of arithmetically changing each of the regions of the model; and (f) repeating steps (b), (c), (d), and (e) until the output data from the model does correspond to the set of historically known output data.

20 Claims, 6 Drawing Sheets

METHOD FOR HISTORY MATCHING A SIMULATION MODEL USING SELF ORGANIZING MAPS TO GENERATE REGIONS IN THE SIMULATION MODEL

CROSS REFERENCE TO RELATED APPLICATIONS

This is a Utility Application of prior pending Provisional Application Ser. No. 60/774,589, filed Feb. 17, 2006, and entitled "Method for History Matching a Simulation Model using Self Organizing Maps to generate Regions in the Simulation Model".

BACKGROUND

This specification discloses a method, and its associated System and Program Storage Device and Computer Program, adapted for 'history matching' of numerical simulation models using a Self Organizing Map (SOM) software, the SOM being used to generate and define the 'Regions' among the grid blocks of the numerical simulation model during the history matching procedure.

History matching of numerical models is an inverse problem. That is, a numerical simulation model is adjusted such that, when a set of historically known input parameters are input to the model, a set of historically known output parameters or data will be generated by the model. History matching is therefore a trial and error procedure.

When 'history matching' a numerical simulation model, a set of historically known output parameters should be generated by the model in response to a set of historically known input parameters. However, when the set of historically known output parameters are not generated by the model in response to the set of historically known input parameters, it is necessary to multiply the value of a parameter (e.g. permeability) associated with each grid block of the numerical simulation model by a certain value. However, it is clear that the multiplier cannot be the same number for each grid block of the model. Therefore, when the simulation model represents a reservoir field, such as an oil or gas reservoir field, the engineer defines one or more 'regions' of the reservoir, wherein the same multiplier within a particular 'region' can be used to improve the history match. The selection of the 'regions' of the reservoir field can be accomplished in accordance with a geological model of the reservoir. Very often, one or more 'rectangular boxes' are used to define the 'regions' of the reservoir field. However, the selection of 'rectangular boxes' to define the 'regions' of the reservoir field does not ordinarily comply with nature.

In addition, the selection of 'regions' in accordance with a geological model is very often based on 'static geological information', that is, geological information that is not directly related to hydraulic parameters associated with production from a reservoir or other changes over time (e.g. permeability is derived from a correlation with porosity after the creation of the geological model).

SUMMARY

One aspect of the present invention involves a method of history matching a simulation model, comprising: (a) defining regions exhibiting similar behavior in the model thereby generating the model having a plurality of regions, each of the plurality of regions exhibiting a similar behavior; (b) introducing historically known input data to the model; (c) generating output data from the model in response to the historically known input data; (d) comparing the output data from the model with a set of historically known output data; (e) adjusting the model when the output data from the model does not correspond to the set of historically known output data, the adjusting step including the step of arithmetically changing each of the regions of the model; and (f) repeating steps (b), (c), (d), and (e) until the output data from the model does correspond to the set of historically known output data.

Another aspect of the present invention involves a program storage device readable by a machine tangibly embodying a program of instructions executable by the machine to perform method steps for history matching a simulation model, the method steps comprising: (a) defining regions exhibiting similar behavior in the model thereby generating the model having a plurality of regions, each of the plurality of regions exhibiting a similar behavior; (b) introducing historically known input data to the model; (c) generating output data from the model in response to the historically known input data; (d) comparing the output data from the model with a set of historically known output data; (e) adjusting the model when the output data from the model does not correspond to the set of historically known output data, the adjusting step including the step of arithmetically changing each of the regions of the model; and (f) repeating steps (b), (c), (d), and (e) until the output data from the model does correspond to the set of historically known output data.

Another aspect of the present invention involves a computer program adapted to be executed by a processor, the computer program, when executed by the processor, conducting a process for history matching a simulation model, the process comprising: (a) defining regions exhibiting similar behavior in the model thereby generating the model having a plurality of regions, each of the plurality of regions exhibiting a similar behavior; (b) introducing historically known input data to the model; (c) generating output data from the model in response to the historically known input data; (d) comparing the output data from the model with a set of historically known output data; (e) adjusting the model when the output data from the model does not correspond to the set of historically known output data, the adjusting step including the step of arithmetically changing each of the regions of the model; and (f) repeating steps (b), (c), (d), and (e) until the output data from the model does correspond to the set of historically known output data.

Another aspect of the present invention involves a system adapted for history matching a simulation model, comprising: first apparatus adapted for defining regions exhibiting similar behavior in the model thereby generating the model having a plurality of regions, each of the plurality of regions exhibiting a similar behavior; second apparatus adapted for introducing historically known input data to the model; third apparatus adapted for generating output data from the model in response to the historically known input data; fourth apparatus adapted for comparing the output data from the model with a set of historically known output data; fifth apparatus adapted for adjusting the model when the output data from the model does not correspond to the set of historically known output data, the fifth apparatus including sixth apparatus adapted for arithmetically changing each of the regions of the model; and seventh apparatus adapted for repeating the functions performed by the second, third, fourth, fifth, and sixth apparatus until the output data from the model does correspond to the set of historically known output data.

Further scope of applicability will become apparent from the detailed description presented hereinafter. It should be understood, however, that the detailed description and the specific examples set forth below are given by way of illustration only, since various changes and modifications within the spirit and scope of the invention, as described and claimed in this specification, will become obvious to one skilled in the art from a reading of the following detailed description.

BRIEF DESCRIPTION OF THE DRAWINGS

A full understanding will be obtained from the detailed description presented hereinbelow, and the accompanying drawings which are given by way of illustration only and are not intended to be limitative to any extent, and wherein.

DETAILED DESCRIPTION

Figure 1:
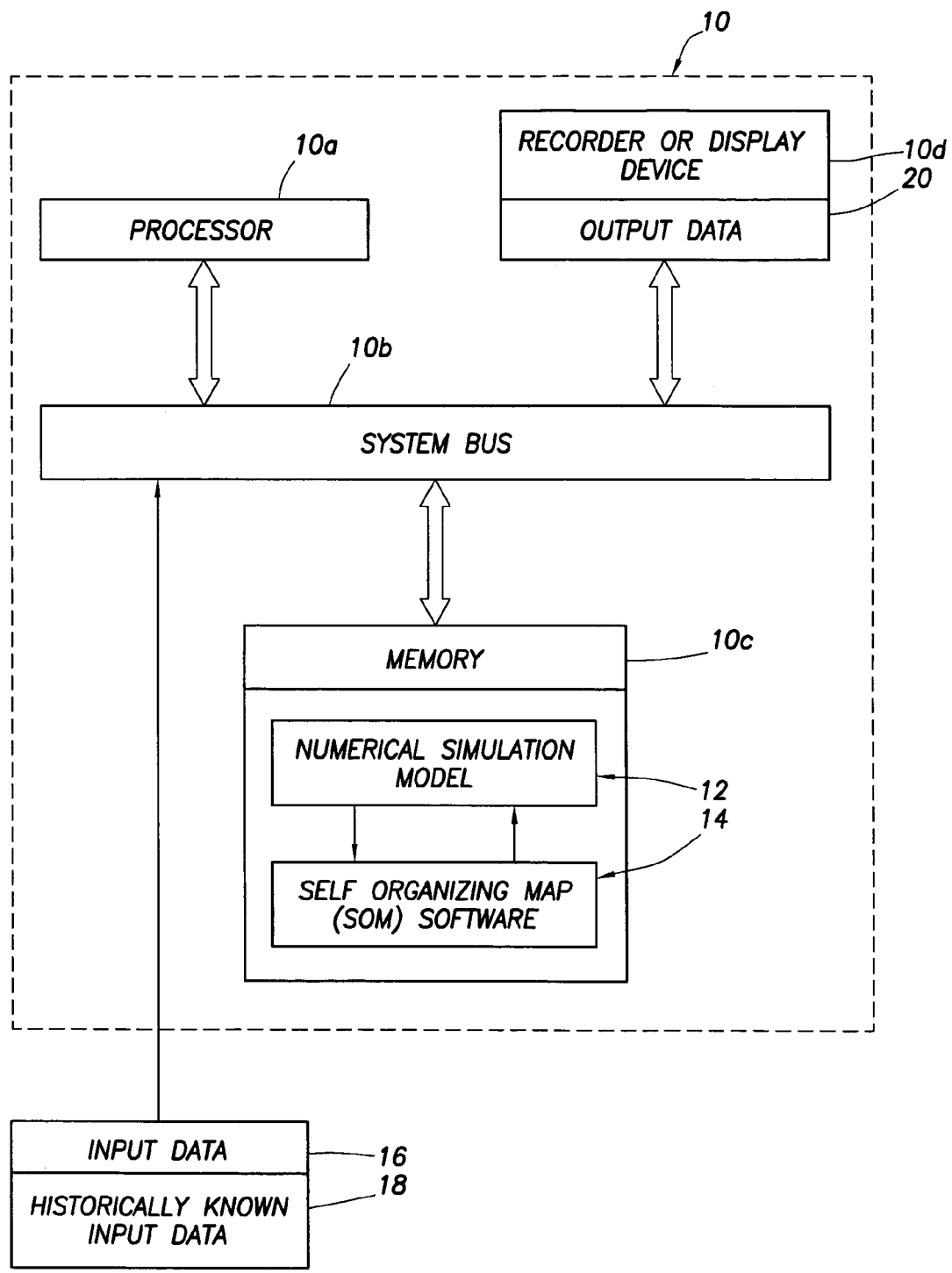
FIG. 1 illustrates a workstation or other computer system wherein the numerical simulation model and the Self Organizing Map (SOM) software is stored.

This specification discloses a 'Method for history matching using Self Organizing Maps (SOM) to generate regions', wherein the novel method uses Self Organizing Maps ("SOM") to compute 'regions' of similar behavior among the grid blocks of a numerical simulation model when 'history matching' the numerical simulation model. This leads to a much faster approach to a correct solution. Instead of hundreds of simulation runs, less than 20 simulation runs are generally necessary in order to achieve a good understanding of the parameter values within the grid blocks of the model. When a good understanding of such parameter values is achieved, a good 'history match' of the numerical simulation model is the result.

A first step associated with the 'Method for history matching using Self Organizing Maps (SOM) to generate regions', as disclosed in this specification, uses SOM to build a set of 'regions' among the grid blocks of the numerical simulation model. That is, instead of grouping grid blocks in accordance with geology, the grid blocks are grouped in accordance with 'regions of similar behavior based on all available information' (hereinafter called 'regions'). The method of Self Organizing Maps (SOM) is used to cluster grid blocks of similar behavior. SOMs can handle all different types of parameters, including model parameters from the initialization, such as initial pressure and saturation. This 'new approach' (i.e., using SOMS to generate 'regions') takes into account several different 'parameters' of each grid block of the model reflecting different physical and numerical processes of hydrocarbon production, including:

geological description: such as lithofacies type hydraulic flow units (HFU): such as permeabilities, porosities initialization: such as water saturations (initial and critical), initial pressure discretization: such as spatial discretization (e.g. DZ), grid block pore volumes PVT regions drainage secondary phase movement: relative permeability endpoints.

Depending on the importance of the parameter of each grid block, its influence can be controlled using a weight factor. This factor is normalized between 0 and 1. The parameter gets the highest weight when the weight factor is one. A parameter has no influence on the clustering when the weight factor is set to 0. The SOM generates rules which are used to identify 'regions' automatically. For example, a rule for one specific 'region' might be:

IF DZ>10.23 AND DZ<27.48 AND
IF PERMX>9.03 AND PERMX<2496.5 AND
IF PERMY>8.53 AND PERMY<665.9 AND
IF PERMZ>0.89 AND PERMZ<440.8 AND
IF PORO>0.077 AND PORO<0.25 AND
IF PORV>1.38e+5 AND PORV<5.26e+5 AND
IF PINI>2485.5 AND PINI<2874.4 AND
IF SWAT>0.06 AND SWAT<0.74
THEN Grid-Block belongs to REGION 1

The advantage of this 'new approach' is its simplicity. Since the Self Organizing Map (SOM) is a self-learning approach, it does not need any expert knowledge to use this technology. The only decision which the user has to make is how many 'regions' the user wants to create.

A second step associated with the 'Method for history matching using Self Organizing Maps (SOM) to generate regions', as disclosed in this specification, includes calculating a Root Mean Square (RMS) error based on 'regions'. To accelerate the match progress, it is necessary to calculate the root mean square (RMS) error based on regions. This means that the direct impact of a parameter change of a region can be compared to the quality of the match in that region. To do that, it is necessary to split up the RMS error per well into the fractions which are contributed by each individual region. Each region, in which a well is perforated, contributes in a different way to the well behavior. As the well behavior is mainly driven by its production, it is also clear that the importance of a region in the well is depending on the product of permeability and thickness (kh). The higher the kh of a region in the perforated part of a well is, the higher its contribution to production will be. This principle is used to split up the well RMS error into an error for each region in which the well is perforated. Summing up all well RMS for one region can be used to determine a regional RMS value. In this way, the direct impact of a change in the region input parameter can be quantified directly.

The 'Method for history matching using Self Organizing Maps (SOM) to generate regions', as disclosed in this specification, represents a clear improvement to to: the 'quality of the history match' and the 'number of runs needed to achieve the history match' of the numerical simulation model.

Referring to FIG. 1, a workstation, personal computer, or other computer system 10 is illustrated adapted for storing a numerical simulation model 12 and a Self Organizing Map (SOM) software 14. The computer system 10 of FIG. 1 includes a processor 10a operatively connected to a system bus 10b, a memory or other program storage device 10c operatively connected to the system bus 10b, and a recorder or display device 10d operatively connected to the system bus 10b. The memory or other program storage device 10c stores the numerical simulation model 12 and the Self Organizing Map (SOM) software 14 which provides an input to and receives an output from the numerical simulation model 12. The numerical simulation model 12 and the Self Organizing Map (SOM) software 14 which is stored in the memory 10c of FIG. 1 can be initially stored on a CD-ROM, where that CD-ROM is also a 'program storage device'. That CD-ROM can be inserted into the computer system 10, and the numerical simulation model 12 and the Self Organizing Map (SOM) software 14 can be loaded from that CD-ROM and into the memory/program storage device 10c of the computer system 10 of FIG. 1. The computer system 10 of FIG. 1 receives 'input data' 16 which includes 'historically known input data' 18. The processor 10a will execute the numerical simulation model 12 and the Self Organizing Map (SOM) software 14 stored in memory 10c while simultaneously using the 'input data' 16 including the 'historically known input data' 18; and, responsive thereto, the processor 10a will generate 'Output Data' 20 which is adapted to be recorded by or displayed on the Recorder or Display device 10d in FIG. 1. The computer system 10 of FIG. 1 will attempt to 'history match' the numerical simulation model 12 with respect to the 'historically known input data' 18 and the 'output data' 20 (to be discussed later in this specification) by using the SOM software 14 to achieve the match. The computer system 10 of FIG. 1 may be a personal computer (PC), a workstation, a microprocessor, or a mainframe. Examples of possible workstations include a Silicon Graphics Indigo 2 workstation or a Sun SPARC workstation or a Sun ULTRA workstation or a Sun BLADE workstation. The memory or program storage device 10c (including the above referenced CD-ROM) is a computer readable medium or a program storage device which is readable by a machine, such as the processor 10a. The processor 10a may be, for example, a microprocessor, microcontroller, or a mainframe or workstation processor. The memory or program storage device 10c, which stores the numerical simulation model 12 and the Self Organizing Map (SOM) software 14, may be, for example, a hard disk, ROM, CD-ROM, DRAM, or other RAM, flash memory, magnetic storage, optical storage, registers, or other volatile and/or non-volatile memory.

Figure 2:
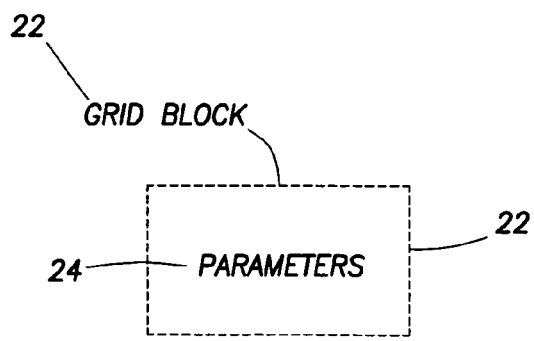
FIG. 2 illustrates a grid block of the numerical simulation model which has a 'parameter' associated therewith.

Referring to FIGS. 2, a grid block 22 is illustrated. The grid block 22 is only one grid block among a multitude of other grid blocks which comprise the numerical simulation model 12, each grid block including grid block 22 having one or more 'parameters' 24 associated therewith. For example, the 'parameters' 24 associated with the grid blocks (including grid block 22) may include permeability or transmissibility or pore volume, as fully described and set forth in U.S. Pat. Nos. 6,078,869 and 6,018,497 to Gunasekera, the disclosures of which are incorporated by reference into this specification. As noted above, the 'parameters' could also include: geological description, such as lithofacies type, hydraulic flow units (HFU), such as permeabilities, porosities, initialization, such as water saturations (initial and critical), initial pressure discretization, such as spatial discretization (e.g. DZ), grid block pore volumes, PVT regions, drainage, and secondary phase movement, such as relative permeability endpoints.

Figure 3:
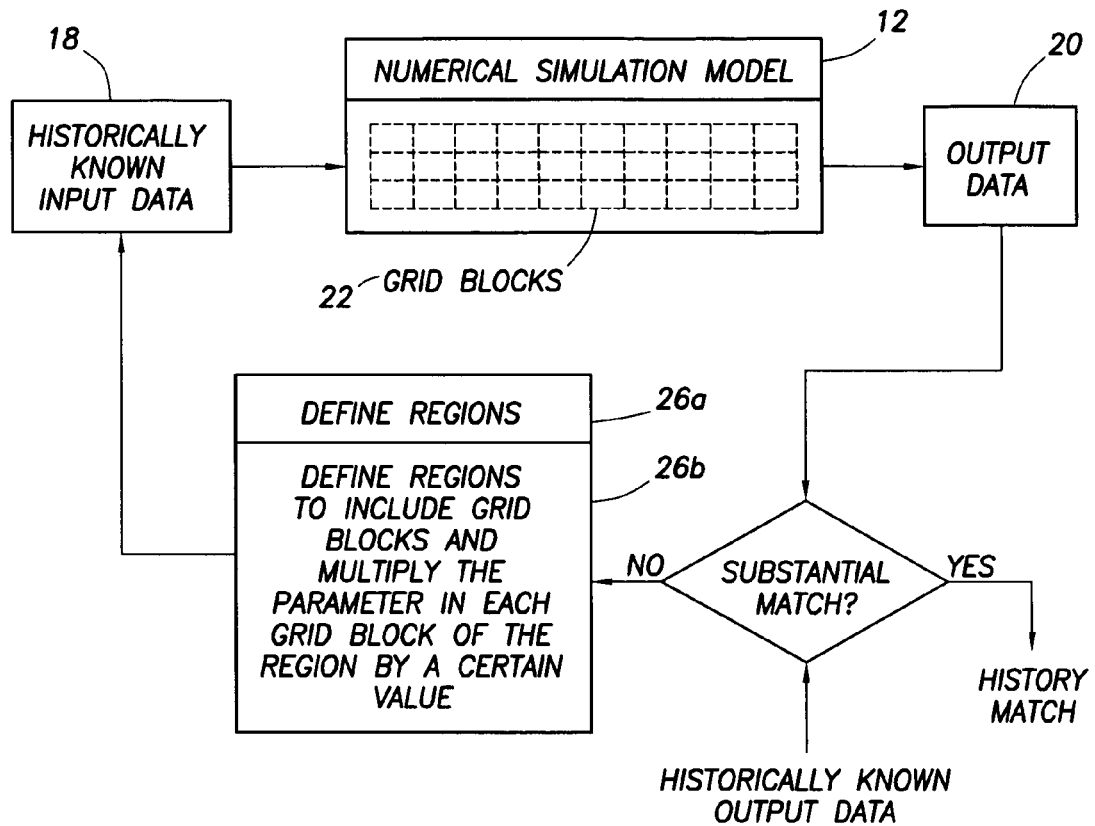
FIG. 3 illustrates the numerical simulation model including a plurality of grid blocks and a method for history matching the numerical simulation model including the method as disclosed in this specification for history matching a simulation model using Self Organizing Maps to generate Regions in the simulation model.

Referring to FIG. 3, a method for 'history matching' the numerical simulation model 12 with respect to the 'historically known input data' 18 and the 'output data' 20 of FIG. 1 is discussed below with reference to FIG. 3. In FIG. 3, the numerical simulation model 12 includes a plurality of the grid blocks 22, each of the plurality of grid blocks 22 of FIG. 3 having one or more 'parameters' 24 associated therewith, such as permeability or transmissibility or pore volume. In FIG. 3, when 'history matching' the numerical simulation model 12, the 'historically known input data' is introduced as 'input data' to the model 12 and, responsive thereto, the 'output data' 20 is generated. That 'output data' 20 is compared against a set of 'historically known output data' which was previously generated (in the past) in response to the 'historically known input data'. When the 'output data' 20 does not substantially match the 'historically known output data', the numerical simulation model 12 must first be 'adjusted' before the 'historically known input data' 18 can again be introduced as 'input data' to the model 12. In order to 'adjust' the model 12, refer to steps or block 26a and 26b of FIG. 3. In step 26a, to 'adjust' the model 12, certain 'regions' must be defined in the numerical simulation model 12. When the 'regions' are defined in the numerical simulation model 12, in step 26b, it is necessary to multiply the 'parameters' 24 in each grid block of each 'region' by a certain value. At this point, the model 12 has been 'adjusted'. Then, the 'historically known input data' 18 is reintroduced, as 'input data', to the model 12, and, responsive thereto, the 'output data' 20 is generated once again. That 'output data' 20 is compared against a set of 'historically known output data' which was previously generated (in the past) in response to the 'historically known input data'. When the 'output data' 20 does not substantially match the 'historically known output data', the numerical simulation model 12 must be 're-adjusted' before the 'historically known input data' 18 can again be introduced as 'input data' to the model 12. In step 26b, in order to 're-adjust' the model 12, it is necessary to multiply the parameters 24 in each grid block of each 'region' by a certain value. At this point, the model 12 has been 're-adjusted'. Then, the 'historically known input data' 18 is reintroduced, as 'input data', to the model 12, and, responsive thereto, the 'output data' 20 is generated once again. This process repeats until the 'output data' 20 does, in fact, substantially match the 'historically known output data'. At this point, the numerical simulation model 12 has been 'history matched'.

Figure 3A:
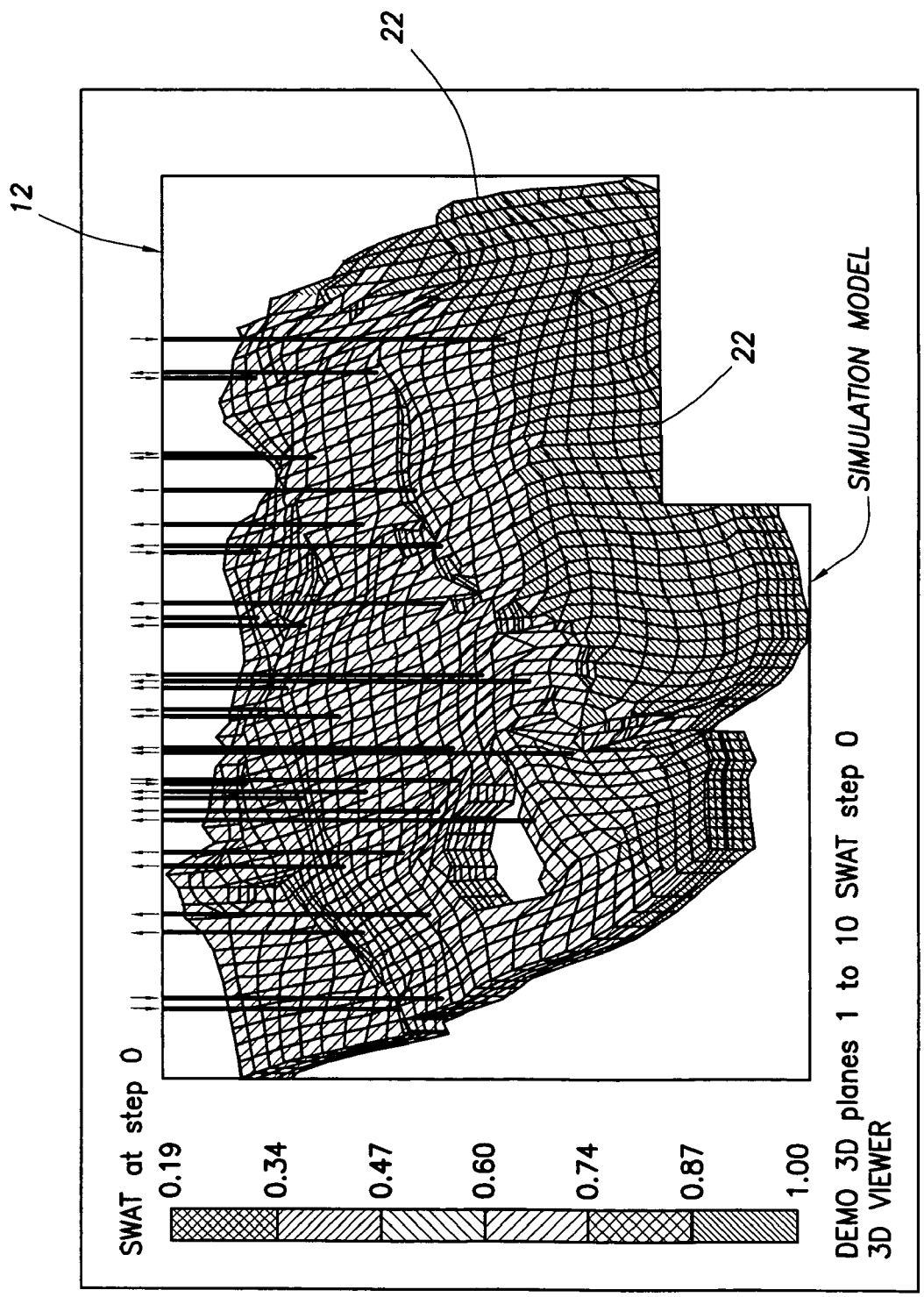
FIG. 3A illustrates a realistic example of the numerical simulation model including the plurality of grid blocks.

Referring to FIG. 3A, a realistic illustration of a typical numerical simulation model 12 of FIG. 3 is illustrated. Note the multitude of grid blocks 22 which have the 'parameters' 24 of FIG. 2 associated therewith.

Figure 4:
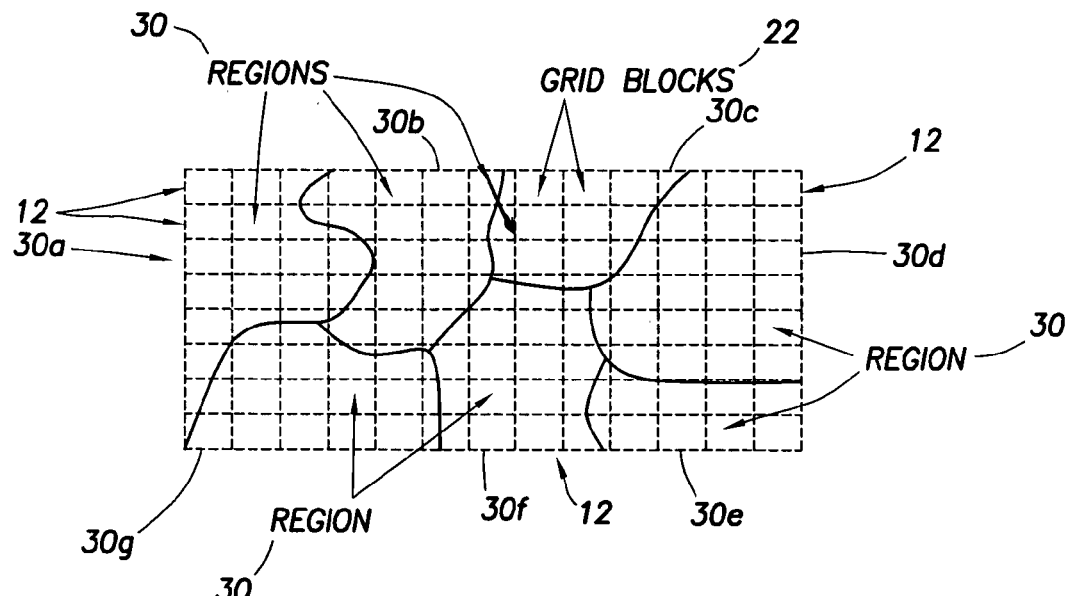
FIG. 4 illustrates the numerical simulation model including a plurality of grid blocks, the model including a plurality of 'regions' where each 'region' of the model further includes one or more of the grid blocks of the numerical simulation model.

Referring to FIG. 4, the numerical simulation model 12 of FIG. 3 is illustrated including a plurality of grid blocks 22. In FIG. 4, the model 12 includes a plurality of 'regions' 30 where each 'region' 30 of the model 12 further includes one or more of the grid blocks 22, each grid block 22 having 'parameters' 24 of FIG. 2 associated therewith. Recall that, in order to 'history match' the numerical simulation model 12, certain 'regions' 30 must be defined in the numerical simulation model 12. When the 'regions' 30 are defined in the numerical simulation model 12, in step 26b of FIG. 3, it is necessary to multiply the 'parameters' 24 (of FIG. 2) in each grid block 22 of the 'region' 30 by a certain value. At this point, the model 12 has been 'adjusted'.

Figure 5:
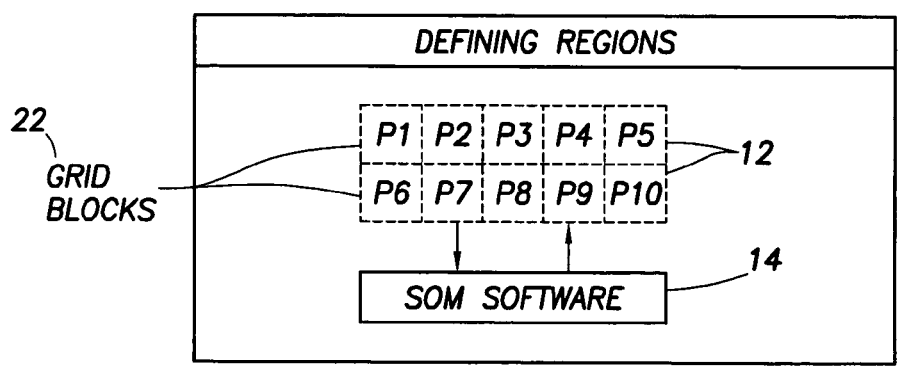
FIG. 5 illustrates how the 'parameters' (in addition to 'all available information') associated with each grid block of the numerical simulation model are introduced, as input data, to the Self Organizing Map (SOM) software, and the SOM software responds by defining the 'regions' of the numerical simulation model which are illustrated in FIG. 4.

Referring to FIGS. 4 and 5, referring initially to FIG. 5, the 'parameters' P1, P2, . . . , and P10 associated with each grid block 22 (in addition to 'all available information' associated with each grid block 22) of the numerical simulation model 12 are introduced, as input data, to the Self Organizing Map (SOM) software 14, and, responsive thereto, the SOM software 14 responds by defining the 'regions' 30 of the numerical simulation model 12 which are illustrated in FIG. 4. In particular, the SOM software 14 will define the 'regions' 30 'of similar behavior' within the numerical simulation model 12. For example, in FIG. 4, the SOM software 14 of FIG. 5 will define: (1) a first 'region 1' 30a having a first particular type of similar behavior, (2) a second 'region 2' 30b having a second particular type of similar behavior, (3) a third 'region 3' 30c having a third particular type of similar behavior, (4) a fourth 'region 4' 30d having a fourth particular type of similar behavior, (5) a fifth 'region 5' 30e having a fifth particular type of similar behavior, (6) a sixth 'region 6' 30f having a sixth particular type of similar behavior, and (7) a seventh 'region 7' 30g having a seventh particular type of similar behavior.

Figure 6:
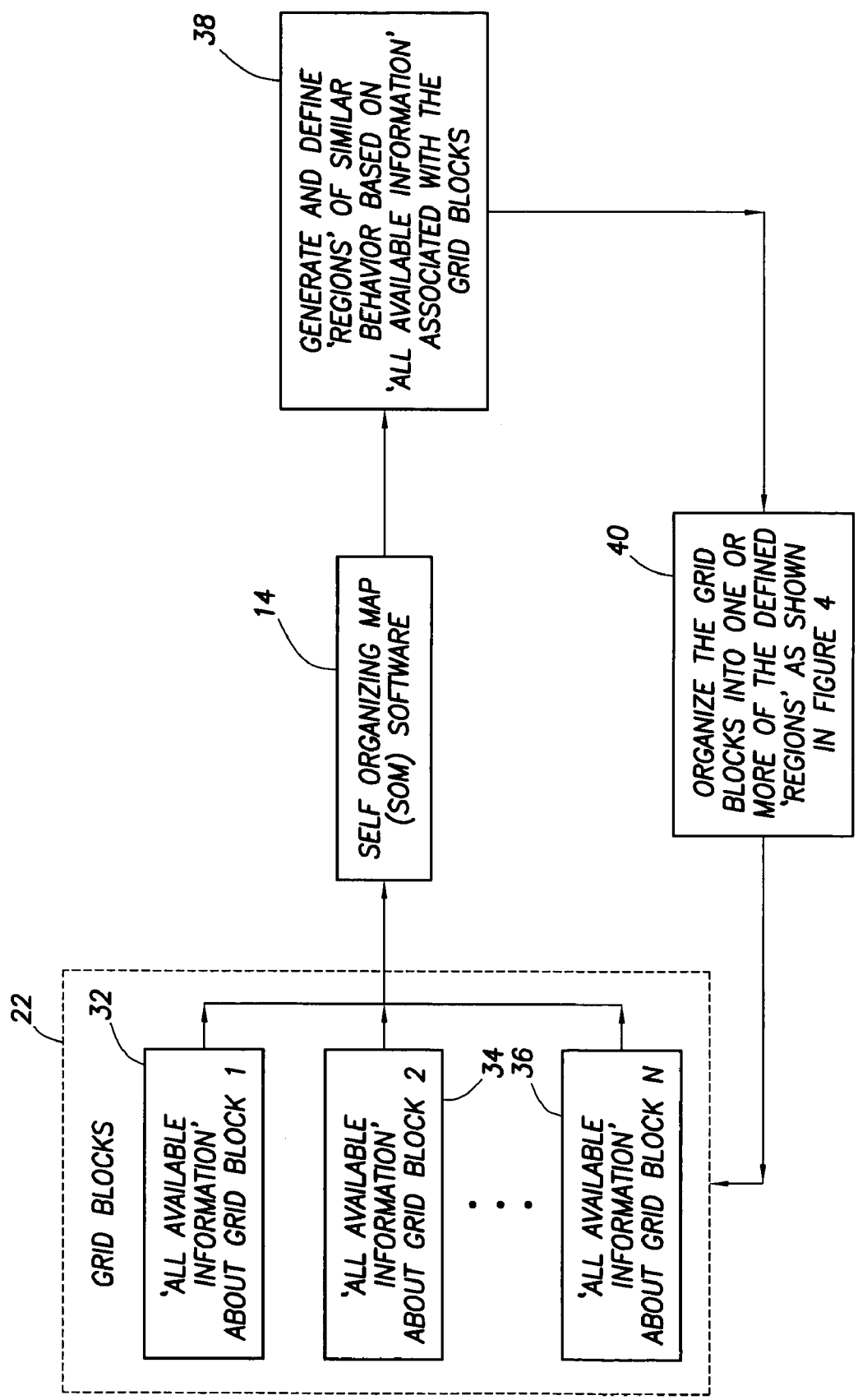
FIG. 6 illustrates how 'all available information' associated with each of the grid blocks of the numerical simulation model is used by the SOM software to generate and define 'regions' of similar behavior among the grid blocks of the numerical simulation model, and, responsive thereto, the SOM software organizes the grid blocks of the numerical simulation model into one or more of the defined 'regions' as illustrated in FIG. 4.

Referring to FIGS. 4 and 6, referring initially to FIG. 6, note that 'all available information' associated with each of the grid blocks 22 of the numerical simulation model 12 is used by the SOM software 14 to generate and define 'regions' 30 of similar behavior among the grid blocks 22 of the numerical simulation model 12, and, responsive thereto, the SOM software 14 organizes the grid blocks 22 of the numerical simulation model 12 into one or more of the defined 'regions' 30a, 30b, 30c, 30d, 30e, 30f, and 30g as illustrated in FIG. 4. In FIG. 6, for example, 'all available information about grid block 1' 32, and 'all available information about grid block 2' 34, . . . , and 'all available information about grid block N' 36 is received by the SOM software 14. In response thereto, the SOM software 14 will 'generate and define regions of similar behavior based on all available information associated with the grid blocks' as indicated by step 38 in FIG. 6. When the 'regions of similar behavior' are defined, as indicated by step 40 in FIG. 6, the SOM software 14 will organize the grid blocks 22 into one or more 'regions' of similar behavior, as shown in FIG. 4. For example, as illustrated in FIG. 4, the SOM software 14 of FIGS. 1, 5, and 6 will: (1) organize the grid blocks 22 into a 'region 1' 30a having a first type of similar behavior, (2) organize the grid blocks 22 into a 'region 2' 30b having a second type of similar behavior, (3) organize the grid blocks 22 into a 'region 3' 30c having a third type of similar behavior, (4) organize the grid blocks 22 into a 'region 4' 30d having a fourth type of similar behavior, (5) organize the grid blocks 22 into a 'region 5' 30e having a fifth type of similar behavior, (6) organize the grid blocks 22 into a 'region 6' 30f having a sixth type of similar behavior, and (7) organize the grid blocks 22 into a 'region 7' 30g having a seventh type of similar behavior.

Figure 7:
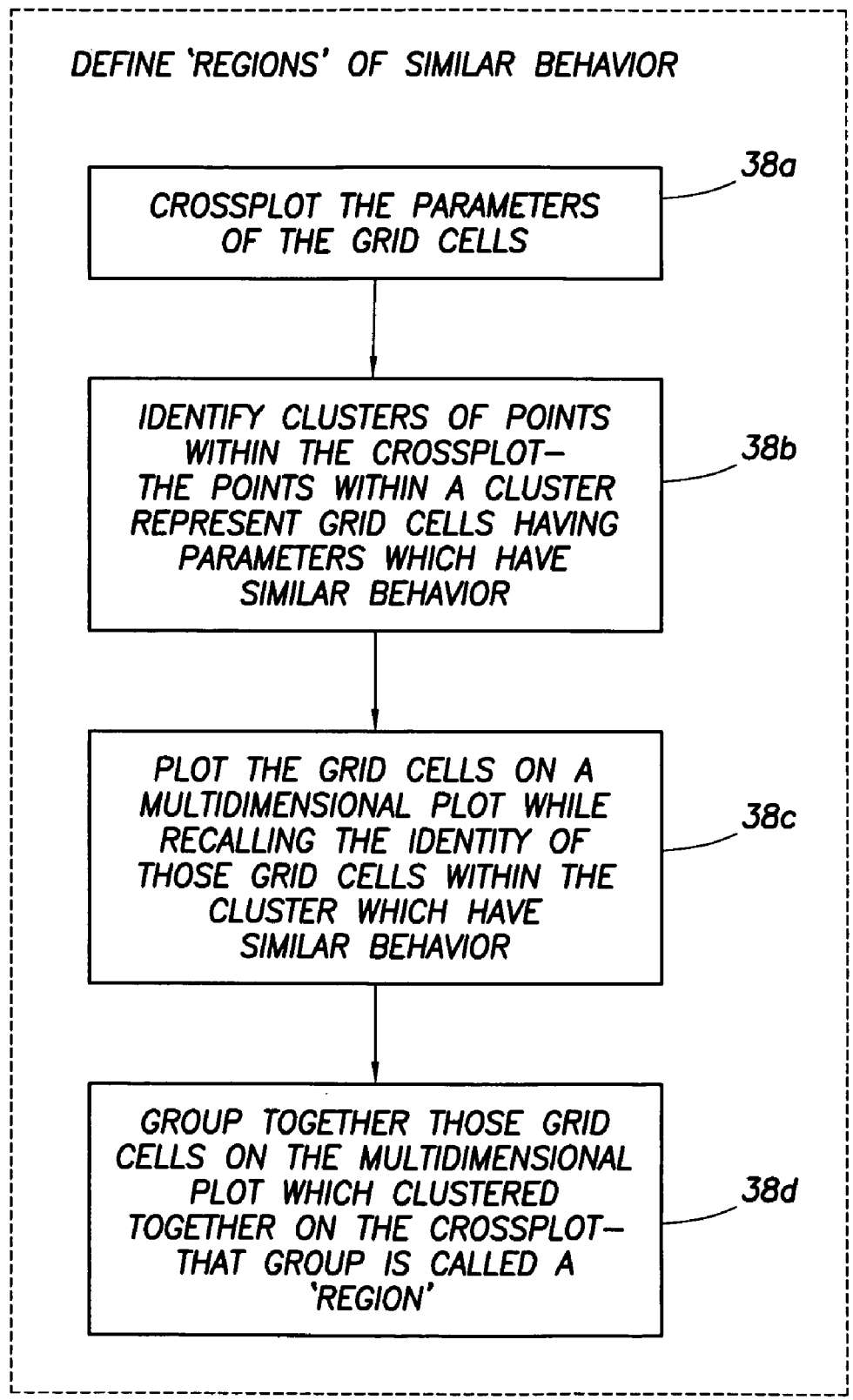
FIG. 7 illustrates a block diagram which describes how the SOM software will define 'regions' of similar behavior among the grid blocks of the numerical simulation model.

Referring to FIG. 7, a block diagram 38 is illustrated which describes how the SOM software 14 of FIGS. 1, 5, and 6 will 'Define Regions of Similar Behavior', as indicated by step 38 in FIG. 6. The block diagram 38 of FIG. 7 representing step 38 in FIG. 6 includes the following sub-steps: step 38a, step 38b, step 38c, and step 38d. In order to fully understand step 38 of FIG. 6 which includes sub-steps 38a-38d as shown in FIG. 7, it would be helpful to read U.S. Pat. No. 6,950,786 to Sonneland et al (hereinafter, the '786 Sonneland et al patent), issued Sep. 27, 2005, entitled "Method and Apparatus for Generating a Cross Plot in Attribute Space from a Plurality of Attribute Data Sets and Generating a Class Data Set from the Cross Plot", with particular reference to FIGS. 16 through 21 of the '786 Sonneland et al patent, the disclosure of which is incorporated by reference into the specification of this application. In FIG. 7, the SOM Software 14 will 'define regions of similar behavior' (as indicated by step 38 in FIG. 6) by executing the following steps: (1) Crossplot the parameters of the grid cells, step 38a of FIG. 7, such as the parameters 24 of the grid cells 22 of FIG. 2, (2) Identify clusters of points within the crossplot—the points within a cluster represent grid cells having parameters which have similar behavior, step 38b, (3) Plot the grid cells on a multidimensional plot while recalling the identity of those grid cells within the cluster which have similar behavior, step 38c, and (4) group together those grid cells on the multidimensional plot which clustered together on the crossplot—that group is called a 'region', step 38d.

A functional description of the operation of the present invention will be set forth below with reference to FIGS. 1 through 7 of the drawings.

In FIG. 3, when 'history matching' the numerical simulation model 12, the 'historically known input data' is introduced as 'input data' to the model 12 and, responsive thereto, the 'output data' 20 is generated. That 'output data' 20 is compared against a set of 'historically known output data' which was previously generated (in the past) in response to the 'historically known input data'. When the 'output data' 20 does not substantially match the 'historically known output data', the numerical simulation model 12 must first be 'adjusted' before the 'historically known input data' 18 can again be introduced as 'input data' to the model 12. In order to 'adjust' the model 12, refer to steps or block 26a and 26b of FIG. 3. In step 26a, in order to 'adjust' the model 12, certain 'regions' 30 of the model 12 of FIG. 4 must be defined and generated in the numerical simulation model 12. The 'regions' 30 of the numerical simulation model 12 of FIG. 4 are defined and generated by the SOM software 14 of FIGS. 1, 5, and 6. The SOM software 14 will define and generate the 'regions' 30 of FIG. 4 by executing the following steps of FIG. 7 (refer to U.S. Pat. No. 6,950,786 to Sonneland et al, with particular reference to FIGS. 16 through 21 of the '786 Sonneland et al patent, the disclosure of which has already been incorporated herein by reference): (1) Crossplot the parameters of the grid cells, step 38a of FIG. 7, such as the parameters 24 of the grid cells 22 of FIG. 2, (2) Identify clusters of points within the crossplot—the points within a cluster represent grid cells having parameters which have similar behavior, step 38b, (3) Plot the grid cells on a multidimensional plot while recalling the identity of those grid cells within the cluster which have similar behavior, step 38c, and (4) group together those grid cells on the multidimensional plot which clustered together on the crossplot—that group is called a 'region', step 38d. When the 'regions' are defined by the SOM software 14 in the numerical simulation model 12, in step 26b of FIG. 3, it is necessary to multiply the 'parameters' 24 in each grid block of each 'region' by a certain 'value'. However, the 'value' for one 'region' may be different from the 'value' for another 'region' because 'it is clear that the multiplier cannot be the same number for each grid block of the model'. At this point, the model 12 has been 'adjusted'. Then, the 'historically known input data' 18 is reintroduced, as 'input data', to the model 12, and, responsive thereto, the 'output data' 20 is generated once again. That 'output data' 20 is compared against a set of 'historically known output data' which was previously generated (in the past) in response to the 'historically known input data'. When the 'output data' 20 does not substantially match the 'historically known output data', the numerical simulation model 12 must be 're-adjusted' in the same manner as discussed above before the 'historically known input data' 18 can again be introduced as 'input data' to the model 12. In step 26b, in order to 're-adjust' the model 12, it may be necessary to: (1) use the SOM software 14 to define the 'regions' 30 of the numerical simulation model 12 of FIG. 4 by executing the steps 38a-38d of FIG. 7 (a step which may have already been accomplished and therefore may not be necessary), and (2) multiply the parameters 24 in each grid block of each newly defined 'region' by a certain value. Again, the 'value' for one 'region' may be different from the 'value' for another 'region' because 'it is clear that the multiplier cannot be the same number for each grid block of the model'. At this point, the model 12 has been 're-adjusted'. Then, the 'historically known input data' 18 is reintroduced, as 'input data', to the model 12, and, responsive thereto, the 'output data' 20 is generated once again. This process repeats until the 'output data' 20 does, in fact, substantially match the 'historically known output data'. At this point, the numerical simulation model 12 has been 'history matched'.

The above description, pertaining to the use of SOM's to define 'regions' during the 'history matching' of numerical simulation models, being thus described, it will be obvious that the same may be varied in many ways. Such variations are not to be regarded as a departure from the spirit and scope of the claimed method or apparatus or program storage device, and all such modifications as would be obvious to one skilled in the art are intended to be included within the scope of the following claims.

We claim:

1. A method of history matching a simulation model, comprising:

(a) defining regions exhibiting similar rule based behavior in said model thereby generating said model having a plurality of regions, each of the plurality of regions including grid cells and exhibiting a similar rule based behavior wherein the defining comprises Self-Organizing Map-based clustering of grid cells, recalling the identity of those grid cells within each cluster which has similar rule based behavior, and grouping together grid cells into groups each group defining a region exhibiting similar rule based behavior according to the clustering;

(b) introducing historically known input data to said model;

(c) generating output data from said model in response to said historically known input data;

(d) comparing said output data from said model with a set of historically known output data to determine an error;

(e) adjusting said model when said output data from said model does not correspond to said set of historically known output data, the adjusting step including the step of arithmetically changing grid cells in one or more each of the regions of said model based at least in part on the error; and (f) repeating steps (b), (c), (d), and (e) until said output data from said model does correspond to said set of historically known output data.

2. The method of claim 1, wherein each grid cell of each region has parameters associated therewith, and wherein the step of arithmetically changing grid cells in one or more of the regions of said model comprises:

multiplying said parameters of each grid cell in one or more of the regions of said model by a value.

3. The method of claim 2, wherein the step of defining regions exhibiting similar rule based behavior in said model comprises: crossploting the parameters of the grid cells on a crossplot, identifying clusters of points within the crossplot, the points within a cluster representing grid cells having parameters exhibiting similar rule based behavior, plotting the grid cells on a multidimensional plot while recalling the identity of those grid cells within the cluster which have similar rule based behavior, and grouping together those grid cells on the multidimensional plot which clustered together on the crossplot, each group defining a region exhibiting similar rule based behavior.

4. A program storage device readable by a machine tangibly embodying a program of instructions executable by the machine to perform method steps for history matching a simulation model, said method steps comprising:

(a) defining regions exhibiting similar rule based behavior in said model thereby generating said model having a plurality of regions, each of the plurality of regions including grid cells and exhibiting a similar rule based behavior wherein the defining comprises Self-Organizing Map-based clustering of grid cells, recalling the identity of those grid cells within each cluster which has similar rule based behavior, and grouping together grid cells into groups, each group defining a region exhibiting similar rule based behavior according to the clustering;

(b) introducing historically known input data to said model;

(c) generating output data from said model in response to said historically known input data;

(d) comparing said output data from said model with a set of historically known output data to determine an error;

(e) adjusting said model when said output data from said model does not correspond to said set of historically known output data, the adjusting step including the step of arithmetically changing grid cells in one or more of the regions of said model based at least in part on the error; and (f) repeating steps (b), (c), (d), and (e) until said output data from said model does correspond to said set of historically known output data.

5. The program storage device of claim 4, wherein each grid cell of each region has parameters associated therewith, and wherein the step of arithmetically changing grid cells in one or more of the regions of said model comprises:

multiplying said parameters of each grid cell in one or more of the regions of said model by a value.

6. The program storage device of claim 5, wherein the step of defining regions exhibiting similar rule based behavior in said model comprises: crossploting the parameters of the grid cells on a crossplot, identifying clusters of points within the crossplot, the points within a cluster representing grid cells having parameters exhibiting similar rule based behavior, plotting the grid cells on a multidimensional plot while recalling the identity of those grid cells within the cluster which have similar rule based behavior, and grouping together those grid cells on the multidimensional plot which clustered together on the crossplot, each group defining a region exhibiting similar rule based behavior.

7. A computer program adapted to be executed by a processor, said computer program, when executed by said processor, conducting a process for history matching a simulation model, said process comprising (a) defining regions exhibiting similar rule based behavior in said model thereby generating said model having a plurality of regions, each of the plurality of regions including grid cells and exhibiting a similar rule based behavior wherein the defining comprises Self-Organizing Map-based clustering of grid cells, recalling the identity of those grid cells within each cluster which has similar rule based behavior, and grouping together grid cells into groups, each group defining a region exhibiting similar rule based behavior according to the clustering;

(b) introducing historically known input data to said model;

(c) generating output data from said model in response to said historically known input data;

(d) comparing said output data from said model with a set of historically known output data to determine an error;

(e) adjusting said model when said output data from said model does not correspond to said set of historically known output data, the adjusting step including the step of arithmetically changing grid cells in one or more of the regions of said model based at least in part on the error; and (f) repeating steps (b), (c), (d), and (e) until said output data from said model does correspond to said set of historically known output data.

8. The computer program of claim 7, wherein each grid cell of each region has parameters associated therewith, and wherein the step of arithmetically changing grid cells in one or more of the regions of said model comprises:

multiplying said parameters of each grid cell in one or more of the regions of said model by a value.

9. The computer program of claim 8, wherein the step of defining regions exhibiting similar rule based behavior in said model comprises: crossploting the parameters of the grid cells on a crossplot, identifying clusters of points within the crossplot, the points within a cluster representing grid cells having parameters exhibiting similar rule based behavior, plotting the grid cells on a multidimensional plot while recalling the identity of those grid cells within the cluster which have similar rule based behavior, and grouping together those grid cells on the multidimensional plot which clustered together on the crossplot, each group defining a region exhibiting similar rule based behavior.

10. A system adapted for history matching a simulation model, comprising:

A first apparatus defining regions exhibiting similar rule based behavior in said model thereby generating said model having a plurality of regions, each of the plurality of regions including grid cells and defined by Self Organizing Maps as exhibiting a similar rule based behavior wherein the defining comprises Self-Organizing Map-based clustering of grid cells recalling the identity of those grid cells within each cluster which has similar rule based behavior, and grouping together grid cells into groups, each group defining a region exhibiting similar rule based behavior according to the clustering;

a second apparatus introducing historically known input data to said model;

a third apparatus generating output data from said model in response to said historically known input data;

a fourth apparatus comparing said output data from said model with a set of historically known output data to determine an error;

a fifth apparatus adapted adjusting said model when said output data from said model does not correspond to said set of historically known output data, the fifth apparatus including sixth apparatus arithmetically changing grid cells in one or more each of the regions of said model based at least in part on the error; and seventh apparatus repeating the functions performed by the second, third, fourth, fifth, and sixth apparatus until said output data from said model does correspond to said set of historically known output data.

11. The system of claim 10, wherein each grid cell of each region has parameters associated therewith, and wherein the sixth apparatus arithmetically changing grid cells in one or more of the regions of said model comprises: apparatus multiplying said parameters of each grid cell in one or more of the regions of said model by a value.

12. The system of claim 11, wherein the first apparatus defining regions exhibiting similar rule based behavior in said model comprises:

apparatus crossploting the parameters of the grid cells on a crossplot, apparatus identifying clusters of points within the crossplot, the points within a cluster representing grid cells having parameters exhibiting similar rule based behavior, apparatus plotting the grid cells on a multidimensional plot while recalling the identity of those grid cells within the cluster which have similar rule based behavior, and apparatus grouping together those grid cells on the multidimensional plot which clustered together on the crossplot, each group defining a region exhibiting similar rule based behavior.

13. One or more computer-readable media comprising processor-executable instructions to instruct a computer to:

define regions using Self Organizing Map-based clustering of grid cells that comprises recalling the identity of those grid cells within each cluster which has similar rule based behavior and grouping together grid cells into groups, each group defining a region exhibiting similar rule based behavior according to the clustering;

execute a model based on the regions to provide output data;

determine a model error between the output data and historical data;

adjust one or more grid cell parameters for the grid cells in at least one of the regions based at least in part on the model error; and execute an adjusted model to minimize the model error, the adjusted model based at least in part on the adjusted one or more grid cell parameters.

14. The one or more computer-readable media of claim 13 wherein the model error comprises a root mean square error.

15. The one or more computer-readable media of claim 13 further comprising processor-executable instructions to instruct a computer to:

to split the model error into an error for each of the regions.

16. The one or more computer-readable media of claim 15 wherein the error for each of the regions depends at least in part on the model error and the product of a permeability parameter and a thickness parameter.

17. The one or more computer-readable media of claim 13 wherein the Self Organizing Map-based clustering comprises generating rules to identify regions.

18. The one or more computer-readable media of claim 17 wherein the rules specify upper and lower bounds for one or more grid cell parameters.

19. The one or more computer-readable media of claim 13 wherein a grid cell parameter of a grid cell comprises a weight factor.

20. The one or more computer-readable media of claim 19 wherein the weight factor affects clustering of the grid cell.

* * * * *

UNITED STATES PATENT AND TRADEMARK OFFICE
CERTIFICATE OF CORRECTION

| | | |
|---|---|---|
| PATENT NO. | : 7,805,283 B2 | Page 1 of 1 |
| APPLICATION NO. | : 11/595508 | |
| DATED | : September 28, 2010 | |
| INVENTOR(S) | : Zangl et al. | |

It is certified that error appears in the above-identified patent and that said Letters Patent is hereby corrected as shown below:

In claim 1, at col. 9, lines 49-50, "one or more each of the regions" should read: "one or more of the regions".

In claim 10, at col. 11, line 62, "one or more each of the regions" should read: "one or more of the regions".

Signed and Sealed this
Twenty-sixth Day of April, 2011

David J. Kappos
*Director of the United States Patent and Trademark Office*